US012740438B2

(12) United States Patent
Otremba

(10) Patent No.: US 12,740,438 B2
(45) Date of Patent: Sep. 15, 2026

(54) DIODE LAYER STACK FLIP-CHIP MOUNTED TO A LEADFRAME BY USE OF A COPPER NICKEL TIN METALLIZATION STACK AND DIFFUSION SOLDERING

(71) Applicant: Infineon Technologies Austria AG, Villach (AT)

(72) Inventor: Ralf Otremba, Kaufbeuren (DE)

(73) Assignee: Infineon Technologies Austria AG, Villach (AT)

( * ) Notice: Subject to any disclaimer, the term of this patent is extended or adjusted under 35 U.S.C. 154(b) by 384 days.

(21) Appl. No.: 18/388,386

(22) Filed: Nov. 9, 2023

(65) Prior Publication Data

US 2024/0162125 A1 May 16, 2024

(30) Foreign Application Priority Data

Nov. 15, 2022 (EP) .................................... 22207602

(51) Int. Cl.
*H01L 23/495* (2006.01)
*H10W 70/40* (2026.01)
(Continued)

(52) U.S. Cl.
CPC ....... *H10W 70/457* (2026.01); *H10W 70/415* (2026.01); *H10W 70/466* (2026.01);
(Continued)

(58) Field of Classification Search
CPC . H10W 70/457; H10W 90/00; H10W 70/481; H10W 70/466; H10W 70/415;
(Continued)

(56) References Cited

U.S. PATENT DOCUMENTS 9,773,750 B2 * 9/2017 Bibl ........................ H01L 24/95
2007/0141750 A1 6/2007 Iwasaki et al.
(Continued)

FOREIGN PATENT DOCUMENTS

EP 3852140 A1 7/2021

OTHER PUBLICATIONS

Lee, Byung-Suk , et al., "Cu—Sn and Ni—Sn transient liquid phase bonding for die-attach technology applications in high-temperature power electronics packaging", Journal of Materials Science: Materials in Electronics, vol. 28, No. 11, 2017, 7827-7833.
(Continued)

*Primary Examiner* — William C Trapanese
(74) *Attorney, Agent, or Firm* — Murphy, Bilak & Homiller, PLLC

(57) ABSTRACT

A method for fabricating a diode layer stack comprises providing a diode layer stack including a silicon carbide diode die including a first main surface at an anode side of the diode die and a second main surface opposite to the first main surface at a cathode side of the diode die, a layer stack on the first main surface of the diode die, the layer stack including a copper layer disposed on the first main surface of the diode die, and a tin or indium containing layer disposed above the copper layer; providing a die pad comprising a copper leadframe including a first main surface and a second main surface opposite to the first main surface; and performing a diffusion soldering process for connecting the diode layer stack with the layer stack to the first main surface of the die pad.

21 Claims, 1 Drawing Sheet

(51) Int. Cl.
*H10W 90/00* (2026.01)
*H10W 72/30* (2026.01)
*H10W 72/60* (2026.01)

(52) U.S. Cl.
CPC ......... *H10W 70/481* (2026.01); *H10W 90/00* (2026.01); *H10W 72/344* (2026.01); *H10W 72/352* (2026.01); *H10W 72/641* (2026.01)

(58) Field of Classification Search
CPC ......................... H10W 72/641; H10W 72/344; H10W 72/352
See application file for complete search history.

(56) References Cited

U.S. PATENT DOCUMENTS

2007/0166877 A1* 7/2007 Otremba ........... H01L 23/49562 257/E23.044
2012/0235227 A1* 9/2012 Otremba ............. H01L 23/3735 257/329
2013/0270327 A1 10/2013 Yoon
2014/0084453 A1 3/2014 Daubenspeck et al.
2015/0223316 A1 8/2015 Fujino et al.
2016/0111395 A1* 4/2016 Heinrich ............. H01L 25/0655 438/107
2016/0379919 A1* 12/2016 Otremba ........... H01L 23/49568 257/675
2019/0043812 A1 2/2019 Leobandung
2019/0189574 A1 6/2019 Kramp et al.
2019/0295981 A1 9/2019 Roesner et al.
2021/0225795 A1* 7/2021 Otremba ............... H10W 70/66
2023/0369177 A1* 11/2023 Boehm ............... H01L 23/3107

OTHER PUBLICATIONS

Zhao, Weimin , et al., “Thermodynamic descriptions of the binary Ni—Sn and ternary Cu—Ni—Sn systems over entire composition range: A revisit”, Calphad: Computer Coupling of Phase Diagrams and Thermocheistry, vol. 75, 2021, 1-11.

* cited by examiner

DIODE LAYER STACK FLIP-CHIP MOUNTED TO A LEADFRAME BY USE OF A COPPER NICKEL TIN METALLIZATION STACK AND DIFFUSION SOLDERING

TECHNICAL FIELD

The present disclosure is related to a method for fabricating a semiconductor device, and to a semiconductor device.

BACKGROUND

A semiconductor power switch may be provided by a semiconductor transistor device such as a MOSFET (Metal Oxide Semiconductor Field Effect Transistor) or an IGBT (Insulated Gate Bipolar Transistor) device. The development of power semiconductors often involves providing those with higher power densities, i.e. higher currents per unit area. While there are limitations with silicon-based power devices due to limitations of the material, with silicon carbide devices five to ten times higher power densities may be achievable.

There may be a demand to provide an improved concept for silicon carbide devices, which enables silicon carbide devices with reduced lateral dimensions. In particular, there may be a need for further improvement, particularly for improving the current carrying capabilities of wide bandgap power devices, e.g. silicon carbide devices. This relates also to diodes which are connected in parallel with the transistor devices in order to avoid, decrease or minimize overvoltages during switches turn on and turn off.

For these and other reasons there is a need for the present disclosure.

SUMMARY

A first aspect of the present disclosure is related to a method for fabricating a semiconductor device, the method comprising providing a diode layer stack comprising a silicon carbide diode die comprising a first main surface at an anode side of the diode die and a second main surface opposite to the first main surface at a cathode side of the diode die, a layer stack on the first main surface of the diode die, the layer stack comprising a copper layer disposed on the first main surface of the diode die, and a tin or indium containing layer disposed above the copper layer (110), providing a die pad comprising a copper leadframe comprising a first main surface and a second main surface opposite to the first main surface (120), and performing a diffusion soldering process for connecting the diode layer stack with the layer stack to the first main surface of the die pad (130).

A second aspect of the present disclosure is related to a semiconductor device comprising A semiconductor device comprising a die pad comprising a copper leadframe comprising a first main surface and a second main surface opposite to the first main surface, a silicon carbide diode die comprising a first main surface at an anode side of the diode die and a second main surface opposite to the first main surface at a cathode side of the diode die, and an intermetallic compound layer disposed between the die pad and the diode die, the intermetallic compound layer comprising copper and tin.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DESCRIPTION OF EMBODIMENTS

Figure 1:
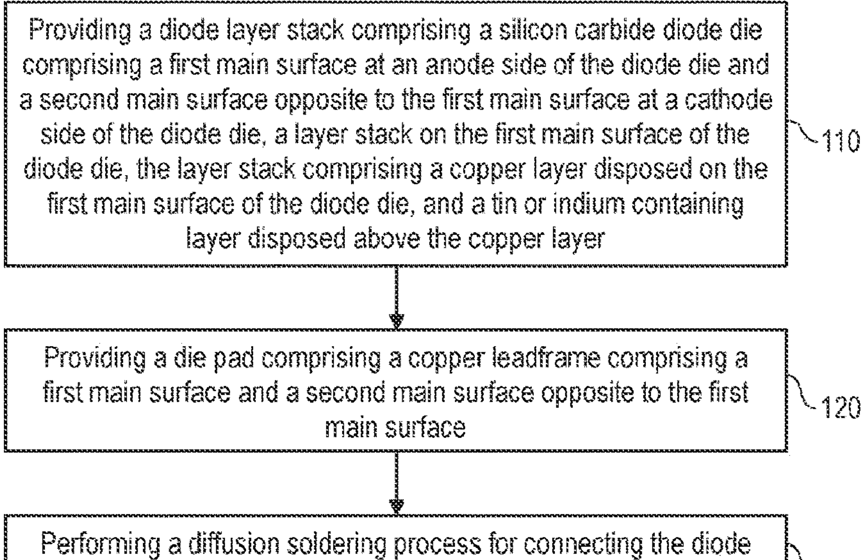
FIG. 1 shows a flow diagram illustrating an example of a method for fabricating a semiconductor device according to the first aspect.

In the following detailed description, reference is made to the accompanying drawings, which form a part hereof, and in which is shown by way of illustration specific embodiments in which the disclosure may be practiced. In this regard, directional terminology, such as “top”, “bottom”, “front”, “back”, “leading”, “trailing”, etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms “bonded”, “attached”, “connected”, “coupled” and/or “electrically connected/electrically coupled” are not meant to mean that the elements or layers must directly be contacted together; intervening elements or layers may be provided between the “bonded”, “attached”, “connected”, “coupled” and/or “electrically connected/electrically coupled” elements, respectively. However, in accordance with the disclosure, the abovementioned terms may, optionally, also have the specific meaning that the elements or layers are directly contacted together, i.e. that no intervening elements or layers are provided between the “bonded”, “attached”, “connected”, “coupled” and/or “electrically connected/electrically coupled” elements, respectively.

Further, the word “over” used with regard to a part, element or material layer formed or located “over” a surface may be used herein to mean that the part, element or material layer be located (e.g. placed, formed, deposited, etc.) “indirectly on” the implied surface with one or more additional parts, elements or layers being arranged between the implied surface and the part, element or material layer. However, the word “over” used with regard to a part, element or material layer formed or located “over” a surface may, optionally, also have the specific meaning that the part, element or material layer be located (e.g. placed, formed, deposited, etc.) "directly on", e.g. in direct contact with, the implied surface.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

DETAILED DESCRIPTION

FIG. 1 shows a flow diagram illustrating an example of a method for fabricating a semiconductor device according to the first aspect.

More specifically, the method 100 of FIG. 1 comprises providing a diode layer stack comprising a silicon carbide diode die comprising a first main surface at an anode side of the diode die and a second main surface opposite to the first main surface at a cathode side of the diode die, a layer stack on the first main surface of the diode die, the layer stack comprising a copper layer disposed on the first main surface of the diode die, and a tin or indium containing layer disposed above the copper layer (110), providing a die pad comprising a copper leadframe comprising a first main surface and a second main surface opposite to the first main surface (120), and performing a diffusion soldering process for connecting the diode layer stack with the layer stack to the first main surface of the die pad (130).

According to an embodiment of the method of FIG. 1, the layer stack further comprises a nickel containing layer disposed on the copper layer, wherein the tin containing layer is disposed on the nickel containing layer. According to an example thereof, the nickel containing layer comprises pure nickel or an alloy of nickel with vanadium and/or phosphor.

According to an embodiment of the method of FIG. 1, the copper leadframe further comprises nickel containing layers disposed on both of the first and second main surfaces thereof. According to an example thereof, one or both of the nickel containing layers comprise pure nickel or an alloy of nickel with vanadium and/or phosphor.

According to an embodiment of the method of FIG. 1, the tin or indium containing layer comprises pure tin or pure indium or an alloy of tin and gold or an alloy of indium and gold.

According to an embodiment of the method of FIG. 1, a thickness of the copper layer and the potential nickel layer of the layer stack of the diode layer stack is in a range from 10 μm to 100 μm.

According to an embodiment of the method of FIG. 1, a thickness of the tin containing layer of the layer stack of the diode layer stack is in a range from 0.5 μm to 5 μm.

According to an embodiment of the method of FIG. 1, the diode layer stack further comprises a nickel containing layer on a the second main surface of the diode die. According to an example thereof, a thickness of the nickel containing layer on the second main surface of the diode die is in a range from 0.2 μm to 2.0 μm.

According to an embodiment of the method of FIG. 1, a thickness of the diode die is in a range from 80 μm to 150 μm or from 100 μm to 120 μm.

According to an embodiment of the method of FIG. 1, the method further comprises performing the diffusion soldering in a temperature range from 350° C. to 400° C.

According to an embodiment of the method of FIG. 1, the method further comprises performing the diffusion soldering for a time duration in a range from 50 ms to 1 s, in particular for a time duration in a range from 100 ms to 200 ms.

According to an embodiment of the method of FIG. 1, the method further comprises providing a lead and connecting the nickel layer on the second main surface of the diode die by at least one of a bond wire, a wedge, or a clip with the lead. According to an example thereof, a plurality of bond wires, wedges or clips can be provided to connect the nickel layer with the lead.

According to an embodiment of the method of FIG. 1, the semiconductor device can in particular be a power semiconductor device. Here, the term "power semiconductor device" may refer to a semiconductor die providing at least one of high voltage blocking or high current-carrying capabilities. A power semiconductor die may be configured for high currents having a maximum current value of a few Amperes, such as e.g. 10 A, or a maximum current value of up to or exceeding 100 A. Similarly, voltages associated with such current values may have values of a few Volts to a few tens or hundreds or even thousands of Volts.

Figure 2:
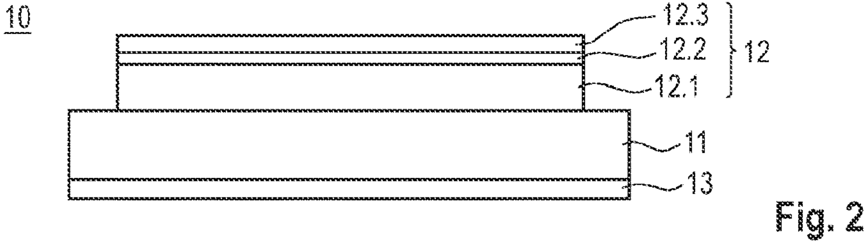
FIG. 2 shows a cross-sectional side view for illustrating an example of a diode layer stack.

FIG. 2 shows a cross-sectional side view for illustrating an example of a diode layer stack.

As shown in FIG. 2, the diode layer stack 10 comprises a silicon carbide diode die 11 comprising a first main surface at an anode side of the diode die 11 and a second main surface opposite to the first main surface at a cathode side of the diode die 11, and a layer stack 12 on the first main surface of the diode die 11, the layer stack 12 comprising a copper layer 12.1 disposed on the first main surface of the diode die 11, and a tin or indium containing layer 12.3 disposed above the copper layer 12.1.

The layer stack 12 may further comprise a nickel containing layer 12.2 disposed on the copper layer 12.1, wherein the tin or indium containing layer 12.3 is disposed on the nickel containing layer 12.2. The nickel containing layer 12.2 may comprise pure nickel or an alloy of nickel with vanadium and/or phosphor. The nickel containing layer 12.2 may be fabricated by plating on an upper surface of the diode die 11.

In case of a tin containing layer 12.3, the layer 12.3 may comprise pure tin or an alloy of tin and gold. In case of an indium containing layer 12.3, the layer 12.3 may comprises pure indium or an alloy of indium and gold.

A thickness of the copper layer 12.1 or of the copper layer 12.1 together with the optional nickel containing layer 12.2 of the layer stack 12 of the diode layer stack 10 is in a range from 10 μm to 100 μm.

A thickness of the tin or indium containing layer 12.3 of the layer stack 12 of the diode layer stack 10 is in a range from 0.5 μm to 5 μm.

The diode layer stack of FIG. 2 may further comprise a nickel containing layer 13 on a second main surface of the diode die 11. According to an example thereof, the nickel containing layer 13 may comprise pure nickel or an alloy of nickel and vanadium and/or phosphor.

A thickness of the nickel containing layer 13 on the second main surface of the diode die is in a range from 0.2 μm to 2.0 μm.

A thickness of the diode die 11 is in a range from 80 μm to 150 μm or from 100 μm to 120 μm.

The silicon carbide diode die 11 may be configured as a power diode die and may as such provide at least one of high voltage blocking or high current-carrying capabilities. In particular it may be configured for high currents having a maximum current value of a few Amperes, such as e.g. 10 A, or a maximum current value of up to or exceeding 100 A. Similarly, voltages associated with such current values may have values of a few Volts to a few tens or hundreds or even thousands of Volts.

The silicon carbide diode die 11 may comprise a quadratic or rectangular shape. The diode 11 may comprise an area size smaller than 4 $mm^2$, in particular smaller than 2 $mm^2$, in particular smaller than 1 $mm^2$, while an edge length of the diode 11 can be smaller than 2 mm, in particular smaller than 1 mm.

Figure 3:
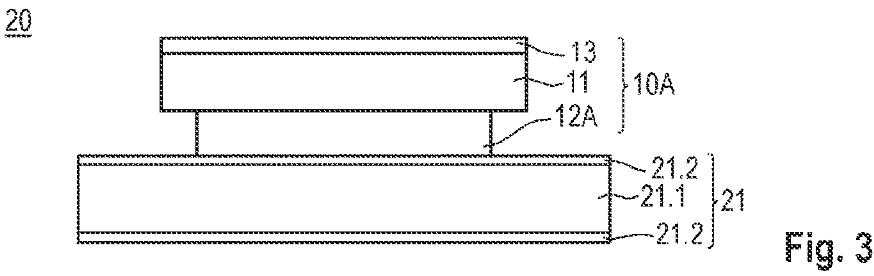
FIG. 3 shows a cross-sectional side view of a first example of a semiconductor device according to the second aspect.

FIG. 3 shows a cross-sectional side view of a first example of a semiconductor device according to the second aspect.

The semiconductor device 20 as shown in FIG. 3 can in particular be obtained by carrying out a method according to the first aspect, in particular after connecting the diode layer stack 10 as shown in FIG. 2 with the layer stack 12 to a surface of a die pad by performing a diffusion soldering process.

Accordingly the semiconductor device 20 of FIG. 3 comprises a die pad 21 comprising a copper leadframe 21.1 comprising a first main surface and a second main surface opposite to the first main surface and a diode layer stack 10A connected to the die pad 21. The diode layer stack 10A comprises a silicon carbide diode die 12 comprising a first main surface at an anode side of the diode die 12 and a second main surface opposite to the first main surface at a cathode side of the diode die 12, and an intermetallic compound layer 12A disposed between the die pad 21 and the diode die 12, the intermetallic compound layer 12A comprising copper and tin.

The intermetallic compound layer 12A can in particular be a result of the diffusion solder process carried out when connecting the diode layer stack 10 with its layer 12 as shown in FIG. 2 to the die pad 21. In other words, the intermetallic compound layer 12A results from the layer stack 12, i.e. the layers 12.1 and 12.3 and the optional layer 12.2.

The intermetallic compound layer 12A may in particular comprise Cu and Sn or In, either in the form of a spatially homogeneous constitution or in the form of a structure in which two outer copper layers enclose an inner tin or In layer.

The intermetallic compound layer 12A may further comprise nickel, in particular in a case in which the layer stack 12 comprises a nickel containing layer 12.2 and/or the die pad 21 comprises a leadframe 21 with an upper nickel containing layer 21.2. In such a case the intermetallic compound layer 12A may comprise a layer sequence Cu, Ni, Sn or In, Ni, Cu, i.e. a layer sequence comprising a symmetry of the Cu and Ni layers around a central Sn or In layer.

Generally speaking, the intermetallic compound layer 12A may comprise a layer structure comprising a symmetry around a central Sn or In layer.

The intermetallic compound layer 12A may in particular comprise as such a melting temperature above 400° C. or it may comprise at least one intermetallic phase having a melting temperature above 400° C.

Furthermore the intermetallic compound layer 12A may comprise a thickness in a range from 10 μm to 120 μm.

Furthermore in the semiconductor device 20 as shown in FIG. 3 the leadframe 21.1 may comprise nickel containing layers 21.2 disposed on both the first and second main surfaces.

Figure 4:
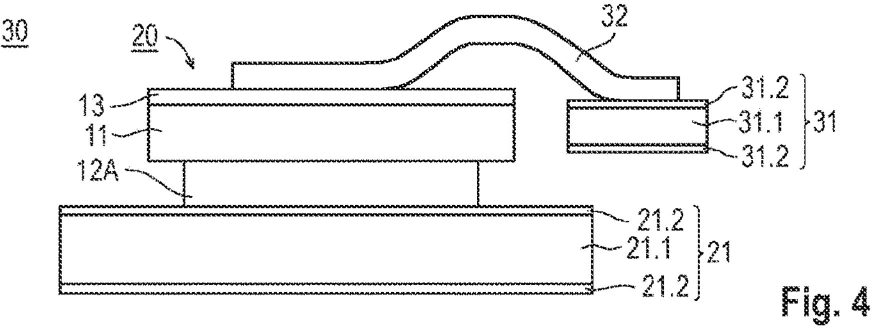
FIG. 4 shows a cross-sectional side view of a second example of a semiconductor device according to the second aspect.

FIG. 4 shows a cross-sectional side view of a second example of a semiconductor device according to the second aspect.

The semiconductor device 30 as shown in FIG. 4 comprises a semiconductor device like e.g. the semiconductor device 20 as shown in FIG. 3. Moreover the semiconductor device 30 further comprises a lead 31 and at least one of a bond wire, a wedge, or a clip 32 connecting the nickel containing layer 13 on the second main surface of the diode die 11 with the lead 31.

The further lead 31 may comprise a copper base body 31.1 and nickel containing layers 31.2 disposed on both main surfaces of the copper base body 31.1.

The at least one bond wire 32 can comprise an aluminum bond wire and can be comprised of a plurality of parallel bond wires, thereby increasing the current carrying capability.

The semiconductor device 20 or 30 can be part of a single chip device, mounted in e.g. a TO package, or part of a multichip device like e.g. a CoolMOS device.

EXAMPLES

In the following specific examples of the present disclosure are described.

Example 1 is a method for fabricating a semiconductor device, the method comprising providing a diode layer stack comprising a silicon carbide diode die comprising a first main surface at an anode side of the diode die and a second main surface opposite to the first main surface at a cathode side of the diode die, a layer stack on the first main surface of the diode die, the layer stack comprising a copper layer disposed on the first main surface of the diode die, and a tin or indium containing layer disposed above the copper layer;

providing a die pad comprising a copper leadframe comprising a first main surface and a second main surface opposite to the first main surface; and performing a diffusion soldering process for connecting the diode layer stack with the layer stack to the first main surface of the die pad.

Example 2 is the method according to Example 1, wherein the layer stack further comprises a nickel containing layer disposed on the copper layer, wherein the tin containing layer is disposed on the nickel containing layer.

Example 3 is the method according to Example 2, wherein the nickel containing layer comprises pure nickel or an alloy of nickel with vanadium and/or phosphor.

Example 4 is the method according to any one of the preceding Examples, wherein the copper leadframe further comprises nickel containing layers disposed on both of the first and second main surfaces thereof.

Example 5 is the method according to Example 4, wherein one or both of the nickel containing layers comprises pure nickel or an alloy of nickel with vanadium and/or phosphor.

Example 6 is the method according to any one of the preceding Examples, wherein the tin or indium containing layer comprises pure tin or pure indium or an alloy of tin and gold or indium and gold.

Example 7 is the method according to any one of the preceding Examples, wherein a thickness of the copper layer and the optional nickel layer of the layer stack is in a range from 10 μm to 100 μm.

Example 8 is the method according to any one of the preceding Examples, wherein a thickness of the tin or indium containing layer of the layer stack is in a range from 0.5 μm to 5 μm.

Example 9 is the method according to any one of the preceding Examples, wherein the diode layer stack further comprises a nickel layer on the second surface of the diode die.

Example 10 is the method according to Example 9, wherein a thickness of the nickel layer on the second main surface of the diode die is in a range from 0.2 μm to 2.0 μm.

Example 11 is the method according to any one of the preceding Examples, further comprising performing the diffusion soldering in a temperature range from 350° C. to 400° C.

Example 12 is the method according to any one of the preceding Examples, further comprising performing the diffusion soldering for a time duration in a range from 50 ms to 1 s or for a time duration in a range from 100 ms to 200 ms.

Example 13 is the method according to any one of the preceding examples, wherein the diode die comprises a nickel or silver layer on the second surface, and the method further comprises providing a lead and connecting the nickel or silver layer of the diode die by at least one of a bond wire, a wedge, or a clip with the lead.

Example 14 a semiconductor device, comprising a die pad comprising a copper leadframe comprising a first main surface and a second main surface opposite to the first main surface, a silicon carbide diode die comprising a first main surface at an anode side of the diode die and a second main surface opposite to the first main surface at a cathode side of the diode die, and an intermetallic compound layer) disposed between the die pad and the diode die, the intermetallic compound layer comprising copper and tin.

Example 15 is the semiconductor device according to Example 14, wherein the intermetallic compound layer comprises a structure in which two outer copper layers enclose an inner tin or indium layer.

Example 16 is the semiconductor device according to Example 14 or 15, wherein the intermetallic compound layer further comprises nickel.

Example 17 is the semiconductor device according to Example 16, wherein the intermetallic compound layer comprises a layer sequence Cu, Ni, Sn or In, Ni, Cu.

Example 18 is the semiconductor device according to any one of Examples 14 to 17, wherein the intermetallic compound layer comprises a thickness in a range from 10 μm to 120 μm.

Example 19 is the semiconductor device according to any one of Examples 14 to 18, wherein the intermetallic compound layer comprises an intermetallic phase having a melting temperature above 400° C.

Example 20 is the semiconductor device according to any one of Examples 14 to 19, wherein the die pad comprises nickel containing layers disposed on both the first and second main surfaces of the leadframe.

Example 21 is the semiconductor device according to any one of Examples 14 to 20, further comprising a lead and at least one of a bond wire, a wedge, or a clip connecting the nickel layer on the second main surface of the diode die with the lead.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A method for fabricating a semiconductor device, the method comprising:

providing a diode layer stack comprising:

a silicon carbide diode die comprising a first main surface at an anode side of the diode die and a second main surface opposite to the first main surface at a cathode side of the diode die, a layer stack on the first main surface of the diode die, the layer stack comprising a copper layer disposed on the first main surface of the diode die, and a tin or indium containing layer disposed above the copper layer;

providing a die pad comprising a copper leadframe comprising a first main surface and a second main surface opposite to the first main surface; and performing a diffusion soldering process for connecting the diode layer stack with the layer stack to the first main surface of the die pad, wherein the diffusion soldering process forms an intermetallic compound from the copper layer and the tin or indium containing layer.

2. The method according to claim 1, wherein the layer stack further comprises a nickel containing layer disposed on the copper layer, wherein the tin containing layer is disposed on the nickel containing layer.

3. The method according to claim 2, wherein the nickel containing layer comprises pure nickel or an alloy of nickel with vanadium and/or phosphor.

4. The method according to claim 1, wherein the copper leadframe further comprises nickel containing layers disposed on both of the first and second main surfaces thereof.

5. The method according to claim 4, wherein one or both of the nickel containing layers comprises pure nickel or an alloy of nickel with vanadium and/or phosphor.

6. The method according to claim 1, wherein the tin or indium containing layer comprises pure tin or pure indium or an alloy of tin and gold or indium and gold.

7. The method according to claim 1, wherein a thickness of the copper layer and the optional nickel layer of the layer stack is in a range from 10 μm to 100 μm.

8. The method according to claim 1, wherein a thickness of the tin or indium containing layer of the layer stack is in a range from 0.5 μm to 5 μm.

9. The method according to claim 1, wherein the diode layer stack further comprises a nickel layer on the second surface of the diode die.

10. The method according to claim 9, wherein a thickness of the nickel layer on the second main surface of the diode die is in a range from 0.2 μm to 2.0 μm.

11. The method according to claim 1, further comprising performing the diffusion soldering in a temperature range from 350° C. to 400° C.

12. The method according to claim 1, further comprising performing the diffusion soldering for a time duration in a range from 50 ms to 1 s or for a time duration in a range from 100 ms to 200 ms.

13. The method according to claim 1, wherein the diode die comprises a nickel or silver layer on the second surface, and the method further comprises providing a lead and connecting the nickel or silver layer of the diode die by at least one of a bond wire, a wedge, or a clip with the lead.

14. A semiconductor device, comprising a die pad comprising a copper leadframe comprising a first main surface and a second main surface opposite to the first main surface;

a silicon carbide diode die comprising a first main surface at an anode side of the diode die and a second main surface opposite to the first main surface at a cathode side of the diode die; and an intermetallic compound layer completely filling the space between the die pad and the diode die, the intermetallic compound layer comprising copper and tin, wherein either:

the intermetallic compound layer comprises a structure in which two outer copper layers enclose an inner Sn or In layer; or the intermetallic compound has a spatially homogeneous constitution of copper and Sn or In.

15. The semiconductor device according to claim 14, wherein the intermetallic compound layer comprises a structure in which two outer copper layers enclose an inner Sn or In layer.

16. The semiconductor device according to claim 14, wherein the intermetallic compound layer further comprises nickel.

17. The semiconductor device according to claim 16, wherein the intermetallic compound layer comprises a layer sequence Cu, Ni, Sn or In, Ni, Cu.

18. The semiconductor device according to claim 14, wherein the intermetallic compound layer comprises a thickness in a range from 10 μm to 120 μm.

19. The semiconductor device according to claim 14, wherein the intermetallic compound layer comprises an intermetallic phase having a melting temperature above 400° C.

20. The semiconductor device according to claim 14, wherein the die pad comprises nickel containing layers disposed on both the first and second main surfaces of the leadframe.

21. The semiconductor device according to claim 14, further comprising a lead and at least one of a bond wire, a wedge, or a clip connecting the nickel layer on the second main surface of the diode die with the lead.

* * * * *